(12) United States Patent
Kim et al.

(10) Patent No.: US 11,961,561 B2
(45) Date of Patent: Apr. 16, 2024

(54) MEMORY DEVICE AND METHOD OF OPERATING THE SAME

(71) Applicant: SK hynix Inc., Gyeonggi-do (KR)

(72) Inventors: Jong Woo Kim, Gyeonggi-do (KR); Young Cheol Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 163 days.

(21) Appl. No.: 17/557,342

(22) Filed: Dec. 21, 2021

(65) Prior Publication Data
US 2023/0048790 A1   Feb. 16, 2023

(30) Foreign Application Priority Data
Aug. 10, 2021 (KR) .......................... 10-2021-0105640

(51) Int. Cl.
| | |
|---|---|
| G11C 16/08 | (2006.01) |
| G11C 16/04 | (2006.01) |
| G11C 16/10 | (2006.01) |
| G11C 16/26 | (2006.01) |
| G11C 16/30 | (2006.01) |
| G11C 16/34 | (2006.01) |

(52) U.S. Cl.
CPC .......... *G11C 16/08* (2013.01); *G11C 16/0483* (2013.01); *G11C 16/10* (2013.01); *G11C 16/26* (2013.01); *G11C 16/30* (2013.01); *G11C 16/3459* (2013.01)

(58) Field of Classification Search
CPC .............................. G11C 7/10; G11C 16/0483
USPC ...................................................... 365/185.12
See application file for complete search history.

(56) References Cited

U.S. PATENT DOCUMENTS

| | | | | |
|---|---|---|---|---|
| 2008/0101120 A1* | 5/2008 | Park | ........................ | G11C 16/10 |
| | | | | 365/185.11 |
| 2020/0192759 A1* | 6/2020 | Hwang | ................... | G11C 29/52 |

FOREIGN PATENT DOCUMENTS

| | | |
|---|---|---|
| KR | 10-2020-0079113 A | 7/2020 |
| KR | 10-2139323 B1 | 7/2020 |

\* cited by examiner

*Primary Examiner* — Anthan Tran
(74) *Attorney, Agent, or Firm* — IP & T GROUP LLP

(57) ABSTRACT

The present technology relates to an electronic device. According to the present technology, a memory device having improved verify accuracy may include a memory block including memory cells, a read and write circuit including a plurality of page buffers, a current sensing circuit configured to perform a verify operation of comparing sensing voltages with a reference voltage, and a control logic configured to control the current sensing circuit to perform the verify operation. The control logic controls performing a first verify operation on each of page buffer groups having a same logical group number, and performing a second verify operation on each of page buffer groups having a same physical group number, and the current sensing circuit outputs a verify pass signal in response to both results of the first verify operation and the second verify operation satisfying a pass criterion.

20 Claims, 13 Drawing Sheets

FIG. 10

| BANK1 Cell Matrix | HIGH BYTE | 0001h | 2501h |
| | | 0009h | 2509h |
| | | 0011h | 2511h |
| | | 0019h | 2519h |
| | | ⋮ | ⋮ |
| | | 24E1h | 49E1h |
| | | 24E9h | 49E9h |
| | | 24F1h | 49F1h |
| | | 24F9h | 49F9h |
| | | Red. | |
| | LOW BYTE | Red. | |
| | | 24FAh | 49FAh |
| | | 24F2h | 49F2h |
| | | 24EAh | 49EAh |
| | | 24E2h | 49E2h |
| | | ⋮ | ⋮ |
| | | 001Ah | 251Ah |
| | | 0012h | 2512h |
| | | 000Ah | 250Ah |
| | | 0002h | 2502h |

| BANK3 Cell Matrix | HIGH BYTE | 0007h | 2507h |
| | | 000Fh | 250Fh |
| | | 0017h | 2517h |
| | | 001Fh | 251Fh |
| | | ⋮ | ⋮ |
| | | 24E7h | 49E7h |
| | | 24EFh | 49EFh |
| | | 24F7h | 49F7h |
| | | 24FFh | 49FFh |
| | | Red. | |
| | LOW BYTE | Red. | |
| | | 24FEh | 49FEh |
| | | 24F6h | 49F6h |
| | | 24EEh | 49EEh |
| | | 24E6h | 49E6h |
| | | ⋮ | ⋮ |
| | | 001Eh | 251Eh |
| | | 0016h | 2516h |
| | | 000Eh | 250Eh |
| | | 0006h | 2506h |

| BANK0 Cell Matrix | HIGH BYTE | 0001h | 2501h |
| | | 0009h | 2509h |
| | | 0011h | 2511h |
| | | 0019h | 2519h |
| | | ⋮ | ⋮ |
| | | 24E1h | 49E1h |
| | | 24E9h | 49E9h |
| | | 24F1h | 49F1h |
| | | 24F9h | 49F9h |
| | | Red. | |
| | LOW BYTE | Red. | |
| | | 24F8h | 49F8h |
| | | 24F0h | 49F0h |
| | | 24E8h | 49E8h |
| | | 24E0h | 49E0h |
| | | ⋮ | ⋮ |
| | | 0018h | 2518h |
| | | 0010h | 2510h |
| | | 0008h | 2508h |
| | | 0000h | 2500h |
| | | EVEN BL | ODD BL |

1010

| BANK2 Cell Matrix | HIGH BYTE | 0005h | 2505h |
| | | 000Dh | 250Dh |
| | | 0015h | 2515h |
| | | 001Dh | 251Dh |
| | | ⋮ | ⋮ |
| | | 24E5h | 49E5h |
| | | 24EDh | 49EDh |
| | | 24F5h | 49F5h |
| | | 24FDh | 49FDh |
| | | Red. | |
| | LOW BYTE | Red. | |
| | | 24FCh | 49FCh |
| | | 24F4h | 49F4h |
| | | 24ECh | 49ECh |
| | | 24E4h | 49E4h |
| | | ⋮ | ⋮ |
| | | 001Ch | 251Ch |
| | | 0014h | 2514h |
| | | 000Ch | 250Ch |
| | | 0004h | 2504h |
| | | EVEN BL | ODD BL |

1020

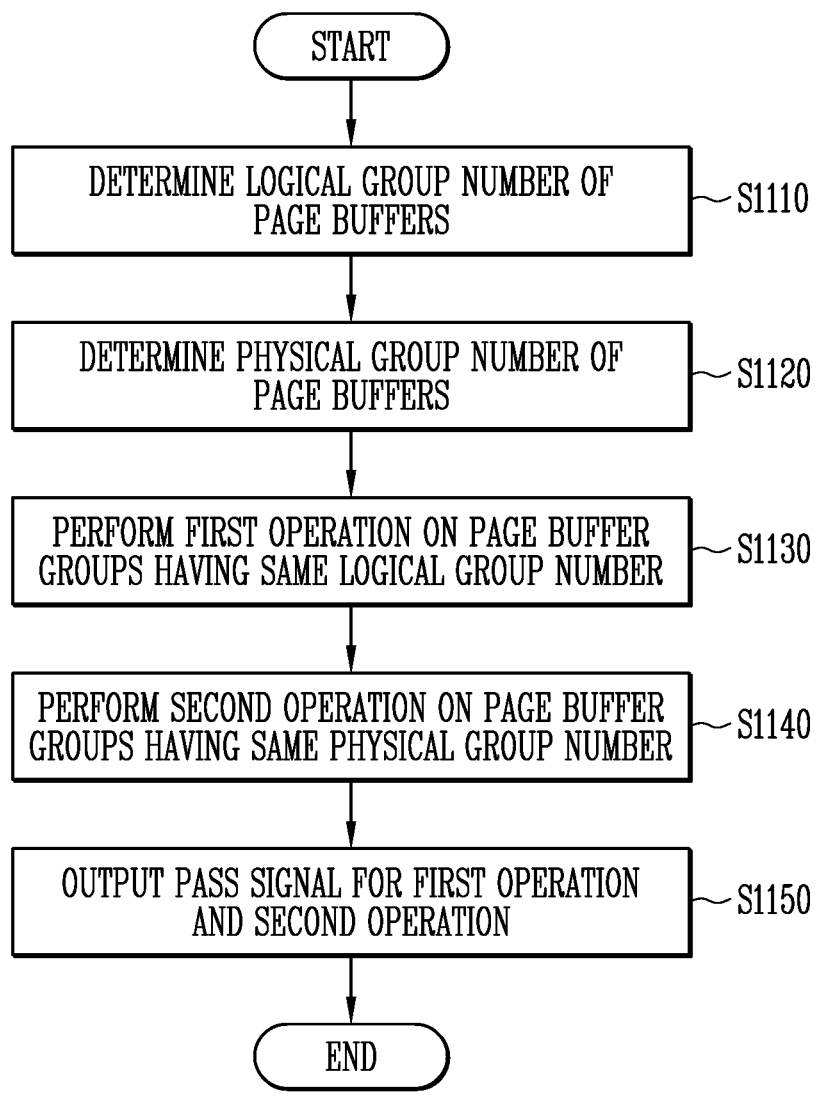

MEMORY DEVICE AND METHOD OF OPERATING THE SAME

CROSS-REFERENCE TO RELATED APPLICATION

The present application claims priority under 35 U.S.C. § 119(a) to Korean patent application number 10-2021-0105640, filed on Aug. 10, 2021, and which is incorporated herein by reference in its entirety.

BACKGROUND

Field of Invention

The present disclosure relates to an electronic device, and more particularly, to a memory device and a method of operating the same.

Description of Related Art

A storage device is a device that stores data under control of a host device such as a computer or a smartphone. The storage device may include a memory device storing data and a memory controller controlling the memory device. The memory device may be classified into a volatile memory device and a nonvolatile memory device.

The volatile memory device may be a device that stores data only when power is supplied and loses the stored data when the power supply is cut off. The volatile memory device may include a static random access memory (SRAM), a dynamic random access memory (DRAM), and the like.

The nonvolatile memory device is a device that does not lose data even though power is cut off. The nonvolatile memory device includes a read only memory (ROM), a programmable ROM (PROM), an electrically programmable ROM (EPROM), an electrically erasable and programmable ROM (EEPROM), a flash memory, and the like.

SUMMARY

An embodiment of the present disclosure provides a memory device having an improved operation speed and a method of operating the same.

According to an embodiment of the present disclosure, a memory device may include a memory block including memory cells, a read and write circuit including a plurality of page buffers respectively connected to the memory cells through a plurality of bit lines, a current sensing circuit configured to perform a verify operation of comparing sensing voltages received from the plurality of page buffers with a reference voltage corresponding to an error correctable bit number, and a control logic configured to group the plurality of page buffers into a plurality of page buffer groups, and control the current sensing circuit to perform the verify operation for each of the plurality of page buffer groups. The control logic is further configured to determine a logical group number and a physical group number corresponding to a column address of each of the plurality of page buffers, and configured to control performing a first verify operation on the sensing voltages of each of page buffer groups having the same logical group number, and performing a second verify operation on the sensing voltages of each of page buffer groups having the same physical group number, and the current sensing circuit is further configured to output a verify pass signal in response to both results of the first verify operation and the second verify operation satisfying a pass criterion.

According to an embodiment of the present disclosure, a method of operating a memory device including a read and write circuit having a plurality of page buffers respectively connected to memory cells included in a memory block through a plurality of bit lines, a current sensing circuit configured to perform a verify operation of comparing sensing voltages received from the plurality of page buffers with a reference voltage corresponding to an error correctable bit number, and a control logic configured to group the plurality of page buffers into a plurality of page buffer groups, and control the current sensing circuit to perform the verify operation for each of the plurality of page buffer groups, may include determining a predetermined number of page buffers having consecutive column addresses among the plurality of page buffers to have the same logical group number, determining a predetermined number of adjacent page buffers in the read and write circuit among the plurality of page buffers to have the same physical group number, performing a first verify operation on the sensing voltages of each of the page buffer groups having the same logical group number, performing a second verify operation on the sensing voltages of each of the page buffer groups having the same physical group number, and outputting a verify pass signal in response to both results of the first operation and the second operation satisfying a pass criterion.

According to an embodiment of the present disclosure, a memory device may include memory cells coupled to respective bit lines, page buffers coupled to the respective bit lines and each configured to sense a voltage of a corresponding one of the memory cells and a control circuit configured to perform, with the sensed voltage, first and second verify operations respectively on first and second groups of the memory cells to determine whether uncorrectable errors are included in the memory cells. The first group is coupled to a first number of bit lines having consecutive column addresses among the bit lines, and the second group is coupled to a second number of physically neighboring ones among the page buffers.

According to the present technology, a memory device having improved accuracy of a verify operation may be provided.

BRIEF DESCRIPTION OF THE DRAWINGS

FIG. 10 is a diagram illustrating a method of grouping a plurality of page buffers into a physical group according to an embodiment of the present disclosure.

FIG. 11 is a flowchart illustrating a method of performing a verify operation according to an embodiment of the present disclosure.

DETAILED DESCRIPTION

Specific structural or functional descriptions of embodiments according to the concepts which are disclosed in the present specification are illustrated only to describe the embodiments according to the concepts of the present disclosure. The embodiments according to the concepts of the present disclosure may be carried out in various forms and should not be construed as being limited to the embodiments described in the present specification.

Figure 1:
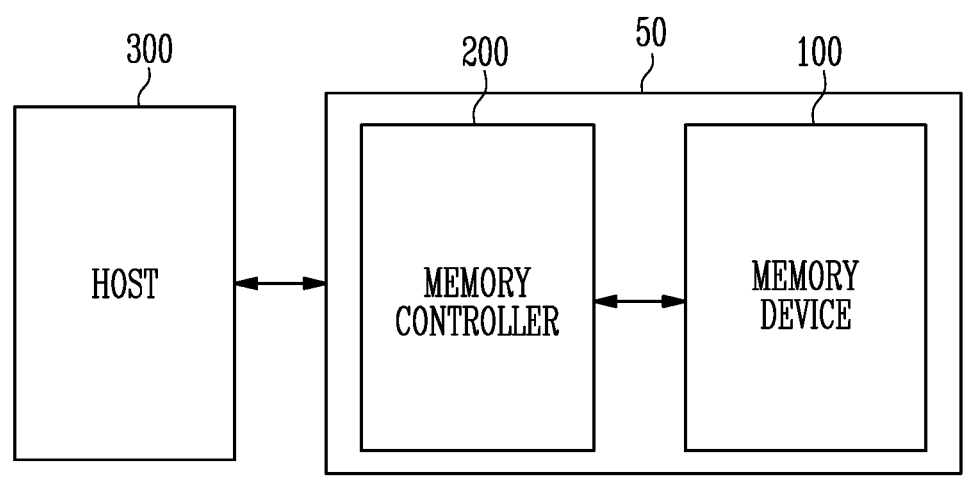
FIG. 1 is a diagram illustrating a storage device including a memory device according to an embodiment of the present disclosure.

FIG. 1 is a diagram illustrating a storage device including a memory device according to an embodiment of the present disclosure.

Referring to FIG. 1, the storage device 50 may include a memory device 100 and a memory controller 200 that controls an operation of the memory device. The storage device 50 may be a device that stores data under control of a host 300 such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host 300. For example, the storage device 50 may be configured as one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-e or PCIe) card type storage device, a compact flash (CF) card, a smart media card, and a memory stick.

The storage device 50 may be manufactured as one of various types of packages. For example, the storage device 50 may be manufactured as one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates under control of the memory controller 200. The memory device 100 may include a memory cell array (not shown) including a plurality of memory cells that store data.

Each of the memory cells may be configured as a single level cell (SLC) that stores one data bit, a multi-level cell (MLC) that stores two data bits, a triple level cell (TLC) that stores three data bits, or a quad level cell (QLC) capable of storing four data bits The memory cell array (not shown) may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like. In the present specification, for convenience of description, the memory device 100 is a NAND flash memory.

The memory device 100 may be configured to receive a command CMD and an address ADDR from the memory controller 200 and access an area selected by the address in the memory cell array. The memory device 100 may perform an operation instructed by the command CMD on the area selected by the address ADDR. For example, the memory device 100 may perform a program operation, a read operation, and an erase operation. During the program operation, the memory device 100 may store data in the area selected by the address ADDR. During the read operation, the memory device 100 may read data from the area selected by the address ADDR. During the erase operation, the memory device 100 may erase data stored in the area selected by the address ADDR.

In an embodiment, the memory device 100 may include a plurality of planes. The plane may be a unit capable of independently performing an operation. For example, the memory device 100 may include two, four, or eight planes. The plurality of planes may independently perform each of the program operation, the read operation, or the erase operation, simultaneously.

The memory controller 200 may control an overall operation of the storage device 50.

When power is applied to the storage device 50, the memory controller 200 may execute firmware (FW). When the memory device 100 is a flash memory device, the firmware (FW) may include a host interface layer (HIL) that controls communication with the host 300, and the memory controller 200 may include a flash translation layer (FTL) that controls communication between the host 300 and the memory device 100, and a flash interface layer (FIL) that controls communication with the memory device 100.

The memory controller 200 may receive write data and the LBA from the host 300 and may convert the LBA into a physical block address (PBA) indicating an address of memory cells included in the memory device 100 in which data is to be stored. In the present specification, the LBA and a "logic address" or a "logical address" may be used as having the same meaning. In the present specification, the PBA and a "physical address" may be used as having the same meaning.

The memory controller 200 may control the memory device 100 to perform the program operation, the read operation, the erase operation, or the like according to a request of the host 300. During the program operation, the memory controller 200 may provide a program command, the PBA, and data to the memory device 100. During the read operation, the memory controller 200 may provide a read command and the PBA to the memory device 100. During the erase operation, the memory controller 200 may provide an erase command and the PBA to the memory device 100.

In an embodiment, the memory controller 200 may generate a command, an address, and data independently regardless of the request from the host 300 and transmit the command, the address, and the data to the memory device 100. For example, the memory controller 200 may provide the command, the address, and the data for performing a read operation and program operations accompanying in performing wear leveling, read reclaim, garbage collection, and the like, to the memory device 100.

In an embodiment, the memory controller 200 may control at least two or more memory devices 100. In this case, the memory controller 200 may control the memory devices 100 according to an interleaving method to improve operation performance. The interleaving method may be a method of controlling operations for at least two memory devices 100 to overlap with each other. Alternatively, the interleaving method may be a method in which at least two or more memory devices 100 operate in parallel.

The buffer memory (not shown) may temporarily store data provided from the host 300, that is, data to be stored in the memory device 100, or may temporarily store data read from the memory device 100. In an embodiment, the buffer memory (not shown) may be a volatile memory device. For example, the buffer memory (not shown) may be a dynamic random access memory (DRAM) or a static random access memory (SRAM).

The host 300 may communicate with the storage device 50 using at least one of various communication standards or protocols such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
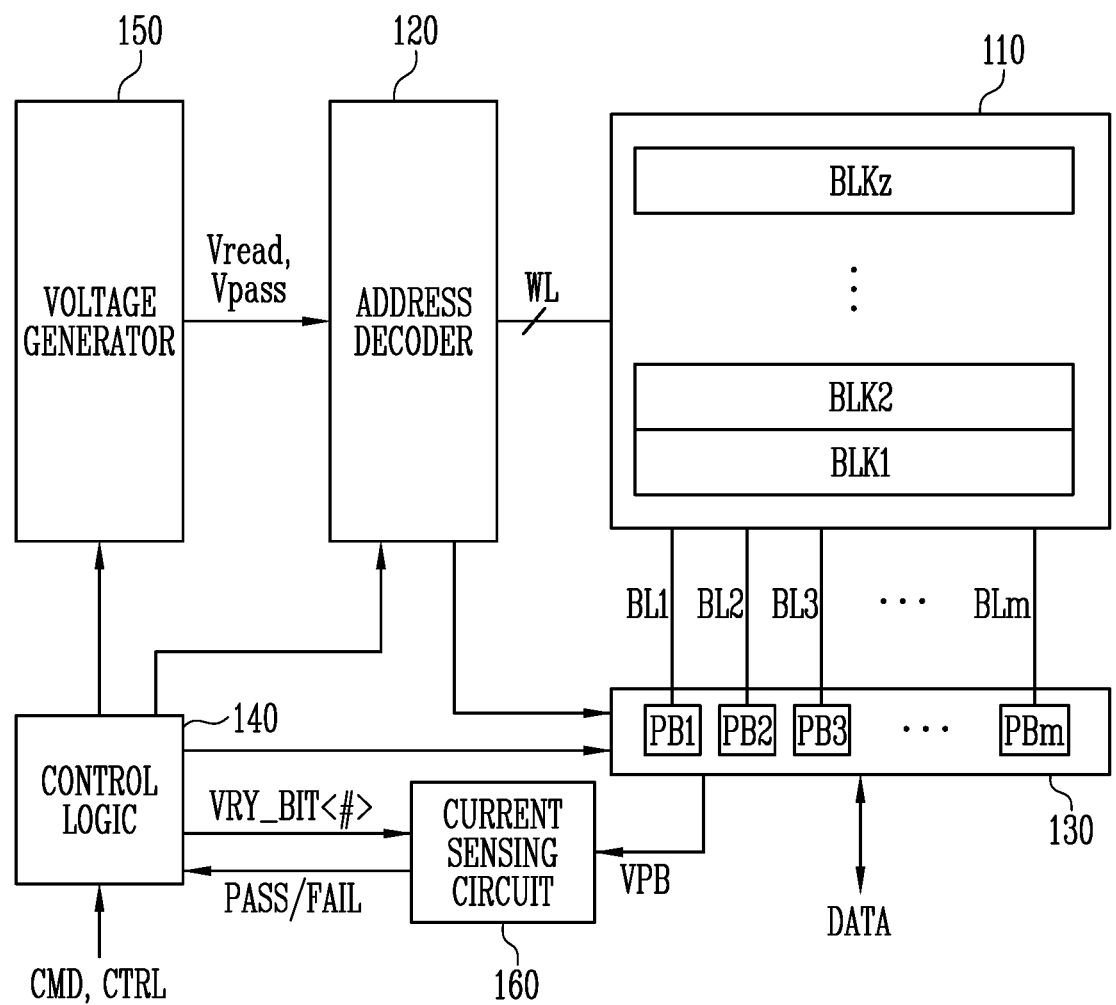
FIG. 2 is a diagram illustrating the memory device of FIG. 1 according to an embodiment of the present disclosure.

FIG. 2 is a diagram illustrating the memory device of FIG. 1 according to an embodiment of the present disclosure.

Referring to FIG. 2, the memory device 100 may include a memory cell array 110, an address decoder 120, a read and write circuit 130, a control logic 140, a voltage generator 150, and a current sensing circuit 160. The address decoder 120, the read and write circuit 130, the voltage generator 150, and the current sensing circuit 160 may be referred to as a peripheral circuit controlled by the control logic 140.

The memory cell array 110 may include a plurality of memory blocks BLK1 to BLKz. The plurality of memory blocks BLK1 to BLKz may be connected to the address decoder 120 through word lines WL. The plurality of memory blocks BLK1 to BLKz may be connected to the read and write circuit 130 through bit lines BL1 to BLm. Each of the plurality of memory blocks BLK1 to BLKz may include a plurality of memory cells. As an embodiment, the plurality of memory cells are non-volatile memory cells, and may be configured of non-volatile memory cells having a vertical channel structure. The memory cell array 110 may be configured as a memory cell array of a two-dimensional structure. According to an embodiment, the memory cell array 110 may be configured as a memory cell array of a three-dimensional structure. Each of the plurality of memory cells included in the memory cell array may store at least one bit of data. In an embodiment, each of the plurality of memory cells included in the memory cell array 110 may be an SLC storing one bit of data. In another embodiment, each of the plurality of memory cells included in the memory cell array 110 may be an MLC storing two bits of data. In still another embodiment, each of the plurality of memory cells included in the memory cell array 110 may be a TLC storing three bits of data. In still another embodiment, each of the plurality of memory cells included in the memory cell array 110 may be a QLC storing four bits of data. According to an embodiment, the memory cell array 110 may include a plurality of memory cells each storing five or more bits of data.

The address decoder 120 may be connected to the memory cell array 110 through the word lines WL. The address decoder 120 may be configured to operate in response to control of the control logic 140. The address decoder 120 may receive an address through an input/output buffer (not shown) inside the memory device 100.

The address decoder 120 may be configured to decode a block address among received addresses. The address decoder 120 may select at least one memory block according to the decoded block address. In addition, the address decoder 120 may apply a read voltage Vread generated in the voltage generator 150 to a selected word line of the selected memory block at a time of a read voltage application operation during a read operation, and apply a pass voltage Vpass to the remaining unselected word lines. In addition, during a program verify operation, the address decoder 120 may apply a verify voltage generated in the voltage generator 150 to the selected word line of the selected memory block, and apply the pass voltage Vpass to the remaining unselected word lines.

The address decoder 120 may be configured to decode a column address of the received addresses. The address decoder 120 may transmit the decoded column address to the read and write circuit 130.

The read operation and the program operation of the memory device 100 may be performed in a page unit. Addresses received at a time of a request for the read operation and the program operation may include a block address, a row address, and a column address. The address decoder 120 may select one memory block and one word line according to the block address and the row address. The column address may be decoded by the address decoder 120 and may be provided to the read and write circuit 130. In the present specification, memory cells connected to one word line may be referred to as a "physical page".

The read and write circuit 130 may include a plurality of page buffers PB1 to PBm. The read and write circuit 130 may operate as a "read circuit" during the read operation of the memory cell array 110 and may operate as a "write circuit" during the write operation of the memory cell array 110. The plurality of page buffers PB1 to PBm may be connected to the memory cell array 110 through the bit lines BL1 to BLm. During the read operation and the program verify operation, in order to sense a threshold voltage of the memory cells, the plurality of page buffers PB1 to PBm may sense a change of an amount of a current flowing according to a programmed state of a corresponding memory cell through a sensing node while consecutively supplying a sensing current to the bit lines connected to the memory cells, and latch the sensed change as sensing data. The read and write circuit 130 may operate in response to page buffer control signals output from the control logic 140. In the present specification, the write operation of the write circuit may be used as having the same meaning as the program operation on the selected memory cells.

During the read operation, the read and write circuit 130 may sense data of the memory cell, temporarily store read data, and output data to the input/output buffer (not shown) of the memory device 100. In an embodiment, the read and write circuit 130 may include a column select circuit, and the like, in addition to the page buffers (or page registers). The read and write circuit 130 may be a page buffer according to an embodiment of the present disclosure.

The control logic 140 may be connected to the address decoder 120, the read and write circuit 130, the voltage generator 150, and the current sensing circuit 160. The control logic 140 may receive the command CMD and a control signal CTRL through the input/output buffer (not shown) of the memory device 100. The control logic 140 may be configured to control overall operations of the memory device 100 in response to the control signal CTRL. In addition, the control logic 140 outputs a control signal for adjusting a sensing node pre-charge potential level of the plurality of page buffers PB1 to PBm. The control logic 140 may control the read and write circuit 130 to perform the read operation of the memory cell array 110.

The control logic 140 may determine whether a verify operation on a specific target program state is passed or failed in response to a verify pass signal PASS or a verify fail signal FAIL received from the current sensing circuit 160.

The voltage generator 150 generates the read voltage Vread and the pass voltage Vpass during the read operation in response to the control signal output from the control logic 140. In order to generate a plurality of voltages having various voltage levels, the voltage generator 150 may include a plurality of pumping capacitors that receive an internal power voltage. The voltage generator 150 may generate the plurality of voltages by selectively activating the plurality of pumping capacitors in response to the control of the control logic 140.

The current sensing circuit 160 may generate a reference current and a reference voltage in response to a permission bit VRY_BTI<#> received from the control logic 140 during a verify operation. A verify pass signal PASS or a verify fail signal FAIL may be output by comparing the generated reference voltage with a sensing voltage VPB received from the page buffers PB1 to PBm included in the read and write circuit 130 or comparing the generated reference current with a sensing current received from the page buffers PB1 to PBm included in the read and write circuit 130.

The address decoder 120, the read and write circuit 130, the voltage generator 150, and the current sensing circuit 160 may function as the "peripheral circuit" that performs the read operation, the write operation, and the erase operation on the memory cell array 110. The peripheral circuit may perform the read operation, the write operation, and the erase operation on the memory cell array 110 based on the control of the control logic 140.

Figure 3:
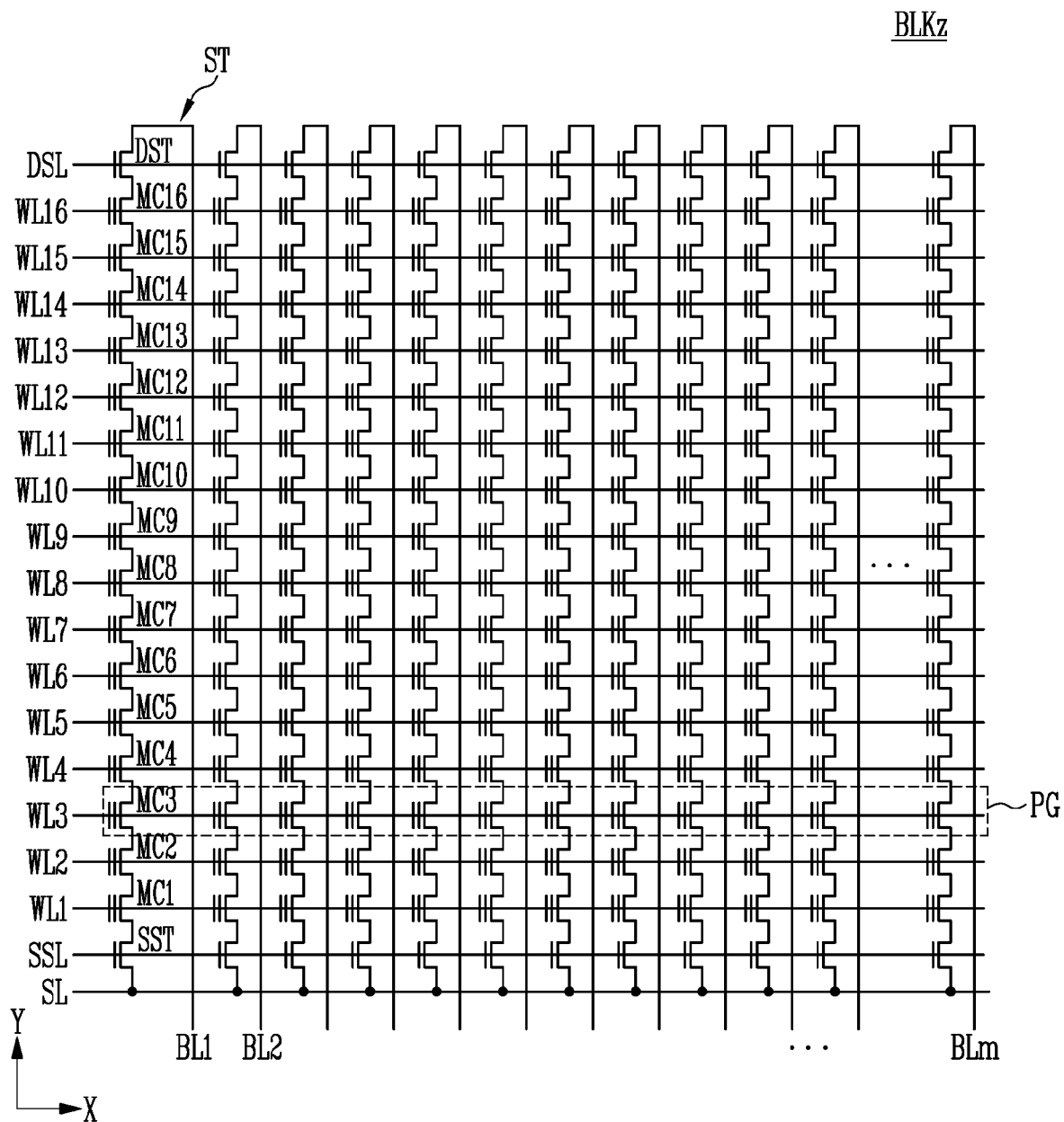
FIG. 3 is a diagram illustrating a configuration of a memory block of FIG. 2 according to an embodiment of the present disclosure.

FIG. 3 is a diagram illustrating a configuration of any one of the memory blocks of FIG. 2 according to an embodiment of the present disclosure.

The memory block BLKz is a memory block BLKz among the memory blocks BLK1 to BLKz of FIG. 2.

Referring to FIG. 3, a plurality of word lines arranged in parallel with each other may be connected between a first select line and a second select line. Here, the first select line may be the source select line SSL, and the second select line may be the drain select line DSL. More specifically, the memory block BLKz may include a plurality of strings ST connected between the bit lines BL1 to BLm and the source line SL. The bit lines BL1 to BLm may be connected to the strings ST, respectively, and the source line SL may be commonly connected to the strings ST. Since the strings ST may be configured identically to each other, a string connected to the first bit line BL1 is specifically described as an example.

The string may include a source select transistor SST, a plurality of memory cells MC1 to MC16, and a drain select transistor DST connected in series between the source line SL and the first bit line BL1. One string may include at least one or more of the source select transistor SST and the drain select transistor DST, and may include more than the number of memory cells MC1 to MC16 shown in the figure.

A source of the source select transistor SST may be connected to the source line SL and a drain of the drain select transistor DST may be connected to the first bit line BL1. The memory cells MC1 to MC16 may be connected in series between the source select transistor SST and the drain select transistor DST. Gates of the source select transistors SST included in the different strings ST may be connected to the source select line SSL, gates of the drain select transistors DST may be connected to the drain select line DSL, and gates of the memory cells MC1 to MC16 may be connected to the plurality of word lines WL1 to WL16. A group of the memory cells connected to the same word line among the memory cells included in different strings ST may be referred to as a page PG. Therefore, the memory block BLKz may include the pages PG of the number of the word lines WL1 to WL16.

One memory cell may store one bit of data. This is commonly called an SLC. In this case, one physical page PG may store one logical page (LPG) data. The one logical page (LPG) data may include the same number of data bits as cells included in one physical page PG.

The one memory cell may store two or more bits of data. In this case, one physical page PG may store two or more logical page (LPG) data.

Figure 4:
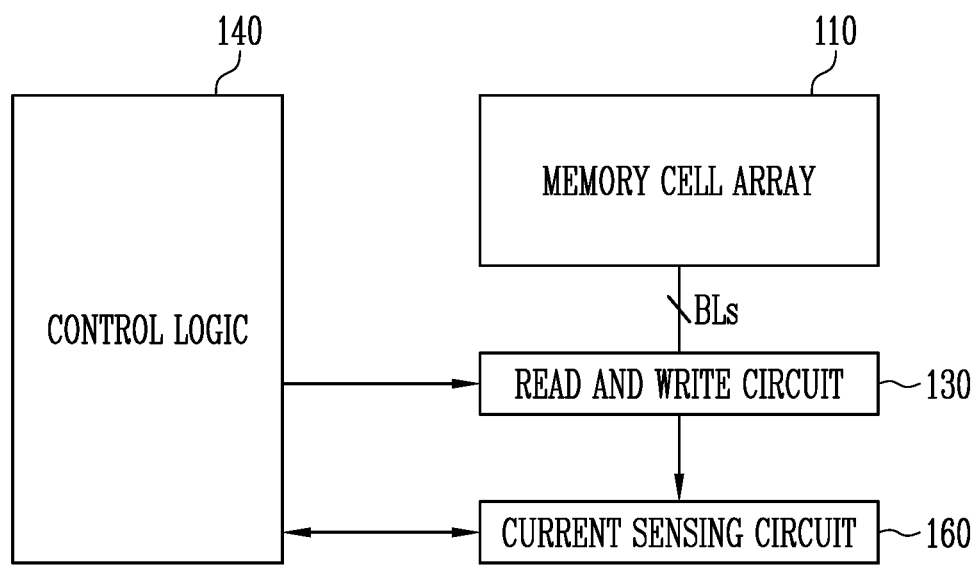
FIG. 4 is a block diagram illustrating a verify operation according to an embodiment of the present disclosure.

FIG. 4 is a block diagram illustrating a verify operation according to an embodiment of the present disclosure.

Referring to FIG. 4, the control logic may control the peripheral circuit including the page buffer and the current sensing circuit. The peripheral circuit may perform the write operation, the read operation, and the erase operation on the memory block included in the memory cell array. The peripheral circuit may apply a voltage to the bit line and the word line of the memory cells included in the memory block. For example, the peripheral circuit may perform the program operation including a plurality of program loops. Each of the plurality of program loops may include a program pulse application operation of increasing a threshold voltage of the memory cells by applying a program pulse, and a verify operation of verifying whether the threshold voltage of the memory cells reaches a target threshold voltage.

According to an embodiment of the present disclosure, the control logic 140 may transmit a control signal to the read and write circuit 130 and the current sensing circuit 160. The memory cell array 110 may include a plurality of memory blocks. The plurality of memory blocks may be connected to the read and write circuit 130 through the bit lines BLs. Each of the plurality of memory blocks may include a plurality of memory cells.

The read and write circuit 130 may include a plurality of page buffers. The plurality of page buffers may be connected to the memory cell array 110 through the bit lines. The plurality of page buffers may transmit sensing data corresponding to an amount of current flowing according to a program state of the corresponding memory cell to the current sensing circuit 160.

The current sensing circuit 160 may receive sensing data from the read and write circuit 130 to perform a verify operation. The verify operation may be an operation of determining whether the memory cells are programmed to a target state, and may include an individual verify operation and an overall verify operation.

The current sensing circuit 160 may generate a reference current and a reference voltage corresponding to an error correctable bit number, and may generate a sensing current and the sensing voltage according to the sensing data. The current sensing circuit 160 may compare the reference voltage and the sensing voltage with each other and transmit a verify pass signal or a verify fail signal to the control logic 140. The current sensing circuit 160 may perform the verify operation of comparing the sensing voltages received from the plurality of page buffers with the reference voltage corresponding to the error correctable bit number.

The control logic 140 may group the plurality of page buffers into a plurality of page buffer groups. The control logic 140 may control the current sensing circuit 160 to perform the verify operation on each of the plurality of page buffer groups.

The control logic 140 may determine a logical group number and a physical group number corresponding to a column address of each of the plurality of page buffers. The control logic 140 may control to perform a first verify operation, which is a verify operation for each of the page buffer groups having the same logical group number. The control logic 140 may control to perform a second verify operation, which is a verify operation for each of the page buffer groups having the same physical group number.

The current sensing circuit 160 may output a verify pass signal in response to both results of the first verify operation and the second verify operation satisfying a pass criterion. The current sensing circuit 160 may perform the first verify operation and the second verify operation in a reverse order. The current sensing circuit 160 may output a verify fail signal in response to the result of the first verify operation that does not satisfy the pass criterion. Even though the result of the first verify operation satisfies the pass criterion, when the result of the second verify operation does not satisfy the pass criterion, the current sensing circuit 160 may output the verify fail signal.

The control logic 140 may determine page buffers having consecutive column addresses among the plurality of page buffers to have the same logical group number. At this time, the number of page buffers having the same logical group number may be predetermined. For example, when the column addresses of the plurality of page buffers are from number 0 to number 1024, it may be determined that the number of page buffers having the same logical group number is 128. The control logic 140 may determine that the logical group number of the page buffers corresponding to column addresses from number 0 to number 127 is number 0. Similarly, the control logic 140 may determine that the logical group number of the page buffers corresponding to column addresses from number 128 to number 255 is number 1.

The control logic 140 may determine page buffers adjacent in the read and write circuit 130 among the plurality of page buffers to have the same physical group number. At this time, the number of page buffers having the same physical group number may be predetermined. It may be determined that the number of page buffers having the same physical group number is 128. For example, the control logic 140 may determine that 128 page buffers adjacent in the read and write circuit 130 have physical group number 0. Column addresses of page buffers having the physical group number may have a difference of 8. That is, the column addresses may be number 0, number 8, number 16, . . . , and number 1016 for the page buffers having the physical group number 0.

In an embodiment of the present disclosure, the control logic 140 may determine the logical group number and the physical group number based on a layout of the plurality of page buffers. The layout of the plurality of page buffers may vary according to a design of the memory device.

The control logic 140 may transmit a first signal indicating the page buffers corresponding to the logical group number to the current sensing circuit. For example, the first signal may indicate that the logical group number of the page buffers corresponding to the column addresses from number 0 to number 127 is number 0, and the logical group number of the page buffers corresponding to the column addresses from number 128 to number 255 is number 1.

The control logic 140 may transmit a second signal indicating the page buffers corresponding to the physical group number to the current sensing circuit. For example, the second signal may indicate that a physical group number of page buffers corresponding to a low byte in bank number 0 is number 0, and a physical group number of page buffers corresponding to a high byte in the bank number 0 is number 1. In another embodiment of the present disclosure, the second signal may indicate that a physical group number of page buffers in which the column address of the page buffer has a difference of 8, such as 0, 8, 16, . . . , and 1016, is number 0.

Figure 5:
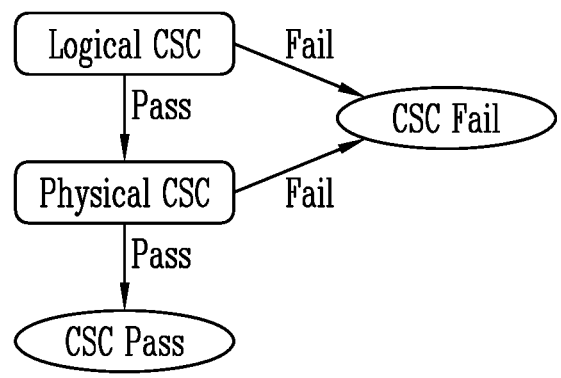
FIG. 5 is a diagram illustrating a verify pass and a verify fail according to an embodiment of the present disclosure.

FIG. 5 is a diagram illustrating a verify pass and a verify fail according to an embodiment of the present disclosure.

Referring to FIG. 5, the current sensing circuit may output the verify pass signal only when both of a logical verify operation and a physical verify operation satisfy a pass condition.

The current sensing circuit may perform the logical verify operation and the physical verify operation. The current sensing circuit may perform the verify operation in a page buffer group unit. The logical verify operation may be performed through a verify operation corresponding to each of the page buffer groups having the same logical group number. The physical verify operation may be performed through a verify operation corresponding to each of the page buffer groups having the same physical group number.

The control logic may control the current sensing circuit to perform the logical verify operation. The control logic may transmit the first signal indicating the page buffers respectively corresponding to the logical group numbers to the current sensing circuit. The current sensing circuit may perform the logical verify operation on the page buffers having the same logical group number based on the first signal.

The control logic may transmit the second signal indicating the page buffers respectively corresponding to the physical group numbers to the current sensing circuit. The current sensing circuit may perform the physical verify operation on the page buffers having the same physical group number based on the second signal.

The current sensing circuit may output the verify pass signal only when the both results of the logical verify operation and the physical verify operation satisfy the verify pass condition. The current sensing circuit may first perform the logical verify operation and perform the physical verify operation after the logical verify operation. Conversely, the current sensing circuit may first perform the physical verify operation, and perform the logical verify operation after the physical verify operation.

The current sensing circuit may output the verify fail signal when one of the result of the logical verify operation and the result of the physical verify operation does not satisfy the pass condition. In an embodiment of the present disclosure, the pass conditions of the logical verify operation and the physical verify operation may be different from each other.

The current sensing circuit may compare the sensing voltage corresponding to the page buffer group with the reference voltage corresponding to the error correctable bit number. When a fail bit included in the page buffer group is distributed, the fail bit may exist even though the verify pass is output. Since the column addresses of the page buffers included in the page buffer group are different from each other, the logical verify operation and the physical verify operation may be complementary to each other.

Figure 6:
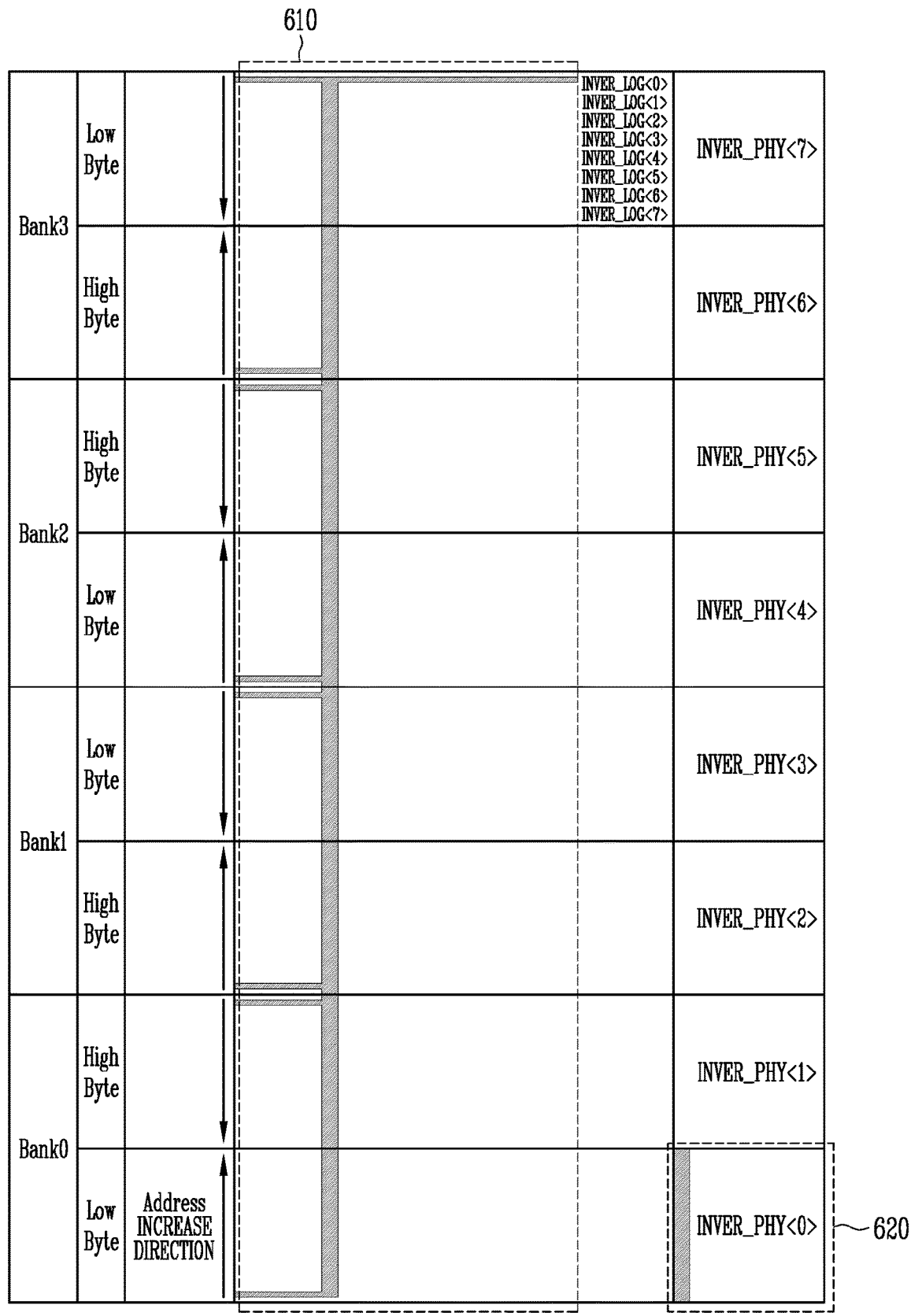
FIG. 6 is a diagram illustrating a method of determining a logical group number and a physical group number according to an embodiment of the present disclosure.

FIG. 6 is a diagram illustrating a method of determining a logical group number and a physical group number according to an embodiment of the present disclosure.

Referring to FIG. 6, the physical page may be divided into four banks. Each of the banks may be divided into a low byte and a high byte. In FIG. 6, page buffers corresponding to column addresses number 0 to number 1023 are grouped. FIG. 6 shows page buffers corresponding to logical group number 0 INVER_LOG<0> and page buffers corresponding to physical group number 0 INVER_PHY<0>.

Column addresses of the page buffers corresponding to the logical group number 0 INVER_LOG<0> may be consecutive. In an embodiment of the present disclosure, the page buffers corresponding to the column addresses number 0 to number 127 may correspond to logical group number 0 INVER_LOG<0> (610). Although not shown in FIG. 6, the page buffers corresponding to the column addresses number 128 to number 255 may correspond to logical group number 1. In a similar method, the page buffers of logical group numbers 2 to 6 may be grouped. Column addresses of page buffers corresponding to logical group number 7 may be from number 896 to number 1023.

The page buffers corresponding to the physical group number 0 INVER_PHY<0> may be page buffers corresponding to a Low Byte of Bank0 (620). Column addresses of the page buffers corresponding to the physical group number 0 INVER_PHY<0> may have a difference of 8. For example, column addresses of 128 page buffers corresponding to the physical group number 0 INVER_PHY<0> may be number 0, number 8, number 16, . . . , and number 1016.

Similarly, page buffers corresponding to physical group number 1 may be page buffers corresponding to a High Byte of the Bank0. Page buffers corresponding to physical group number 2 may be page buffers corresponding to a High Byte of Bank1. Page buffers corresponding to physical group number 3 may be page buffers corresponding to a Low Byte of the Bank1. Page buffers corresponding to physical group number 4 may be page buffers corresponding to a Low Byte of Bank2. Page buffers corresponding to physical group number 5 may be page buffers corresponding to a High Byte of the Bank2. Page buffers corresponding to physical group number 6 may be page buffers corresponding to a High Byte of Bank3. Page buffers corresponding to physical group number 7 may be page buffers corresponding to a Low Byte of the Bank3. Column addresses of the page buffers corresponding to each of the physical group numbers 1 to 7 may also have a difference of 8.

Figure 7:
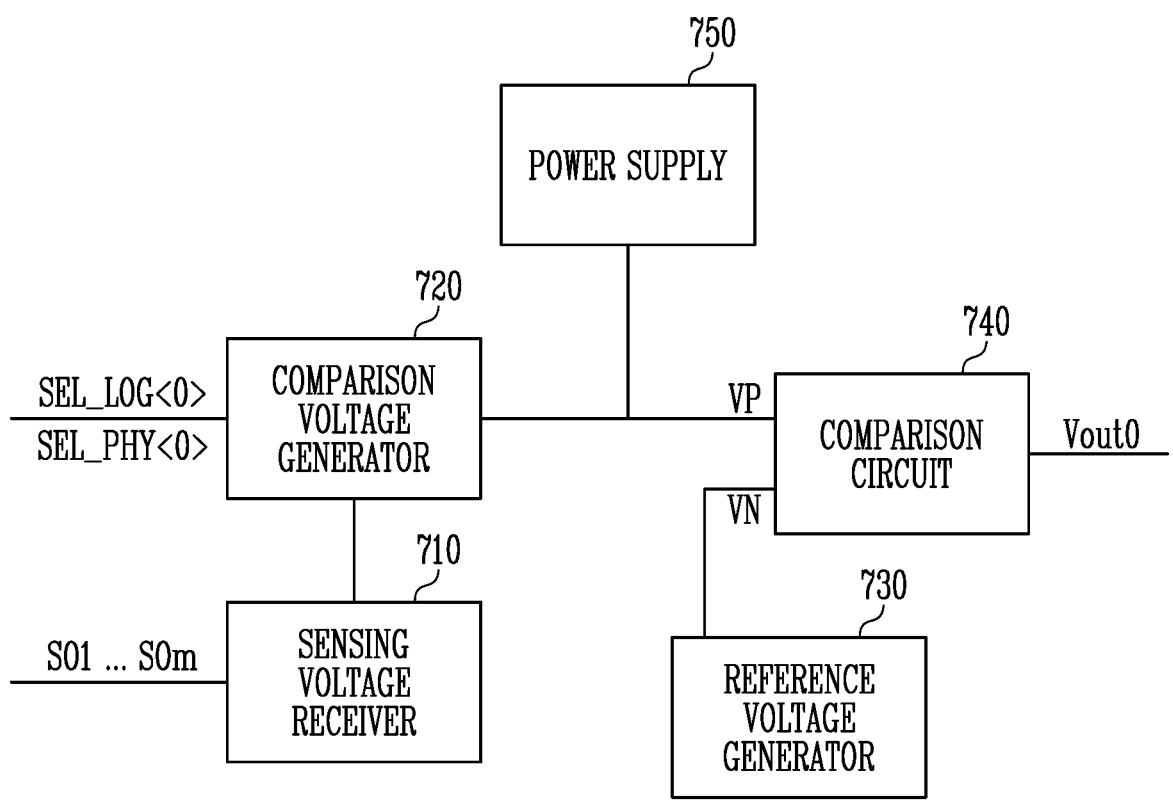
FIG. 7 is a block diagram illustrating a current sensing circuit according to an embodiment of the present disclosure.

FIG. 7 is a block diagram illustrating a current sensing circuit according to an embodiment of the present disclosure.

Referring to FIG. 7, the current sensing circuit may include at least one or more comparators. The number of comparators may be the same as the number of page buffer groups. For example, when the number of page buffer groups is eight, the number of comparators included in the current sensing circuit may also be eight. FIG. 7 may show a comparator corresponding to group number 0 among at least one or more comparators.

In an embodiment of the present disclosure, the current sensing circuit may sum and output the outputs of the comparators. When all outputs of the comparators are verify passes, the current sensing circuit may output the verify pass signal with respect to all page buffers.

The comparator may include a sensing voltage receiver, a comparison voltage generator, a reference voltage generator, a comparison circuit, and a power supply. The sensing voltage receiver 710 may receive the sensing data from the plurality of page buffers. In an embodiment of the present disclosure, the sensing voltage receiver 710 may receive sensing voltages. The sensing voltage may be a voltage stored in a latch circuit of the page buffer.

In an embodiment of the present disclosure, the sensing voltage receiver 710 may receive the sensing data from 'm' number of page buffers. The sensing voltage receiver 710 may receive sensing voltages SO1, . . . , and SOm from page buffer number 1 to page buffer number m. The sensing voltage receiver 710 may provide the received sensing data to the comparison voltage generator 720.

The comparison voltage generator 720 may generate a comparison voltage that is a sum of the sensing voltages to be compared with the reference voltage among the sensing voltages based on the first signal and the second signal received from the control logic. The comparison voltage generator 720 may provide the generated comparison voltage to the comparison circuit 740 through a plus terminal VP of the comparison circuit 740.

In an embodiment of the present disclosure, the first signal may be a signal indicating the page buffers corresponding to the logical group number. The second signal may be a signal indicating the page buffers corresponding to the physical group number. The first signal may include a signal SEL_LOG<0> for selecting page buffers corresponding to logical group number 0 among the page buffers. The second signal may include a signal SEL_PHY<0> for selecting page buffers corresponding to physical group number 0 among the page buffers. In an embodiment of the present disclosure, SEL_LOG<0> and SEL_PHY<0> are not ON simultaneously.

The reference voltage generator 730 may generate the reference voltage corresponding to the error correctable bit number. The reference voltage generator 730 may provide the generated reference voltage to the comparison circuit 740 through a negative terminal VN of the comparison circuit 740.

The comparison circuit 740 may output a comparison result Vout0 obtained by comparing the comparison voltage with the reference voltage. The comparison circuit 740 may output the verify fail signal in response to the comparison voltage exceeding the reference voltage. The comparison circuit 740 may output the verify pass signal in response to the comparison voltage being less than or equal to the reference voltage.

In an embodiment of the present disclosure, the comparison voltage generator 720 may generate a logical comparison voltage that is a sum of the sensing voltages corresponding to the first signal. The comparison circuit 740 may perform a first verify operation of comparing the logical comparison voltage with the reference voltage. The comparison circuit 740 may output a comparison result of the first verify operation. At this time, the comparison voltage generator 720 may generate the logical comparison voltage using at least two or more transistors connected in series.

In an embodiment of the present disclosure, the comparison voltage generator 720 may generate a physical comparison voltage that is a sum of the sensing voltages corresponding to the second signal. The comparison circuit 740 may perform a second verify operation of comparing the physical comparison voltage with the reference voltage. The comparison circuit 740 may output a comparison result of the second verify operation. At this time, the comparison voltage generator 720 may generate the physical comparison voltage using at least two or more transistors connected in series.

The reference voltage generator 730 may generate a first reference voltage corresponding to the comparison voltage generated based on the first signal. The reference voltage generator 730 may generate a second reference voltage corresponding to the comparison voltage generated based on the second signal.

In an embodiment of the present disclosure, the first reference voltage and the second reference voltage may be different from each other. The first reference voltage and the second reference voltage may vary according to the number of activated transistors among a plurality of transistors included in the reference voltage generator 730.

Figure 8:
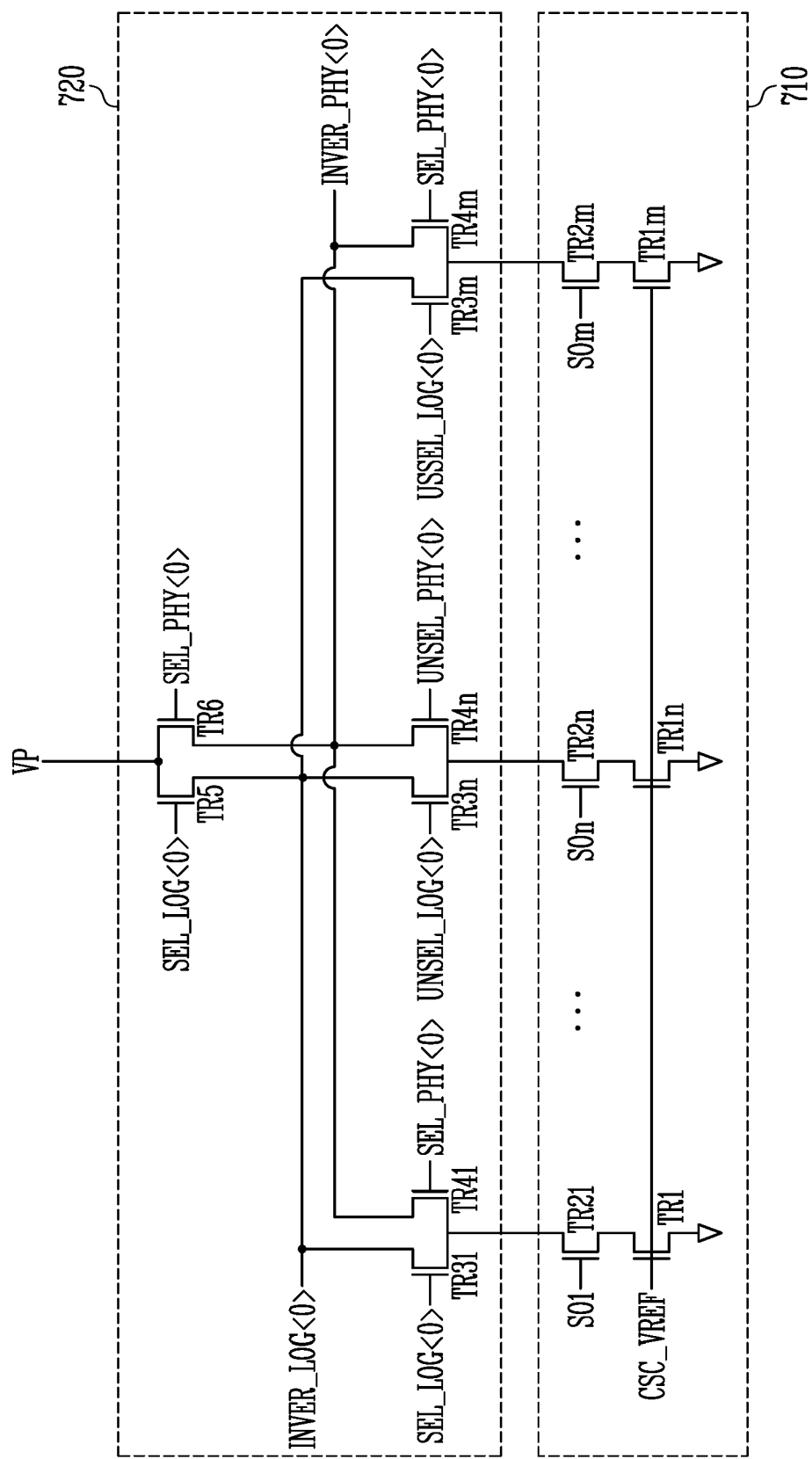
FIG. 8 is a diagram illustrating a sensing voltage receiver and a comparison voltage generator of FIG. 7 according to an embodiment of the present disclosure.

FIG. 8 is a diagram illustrating the sensing voltage receiver and the comparison voltage generator of FIG. 7.

Referring to FIG. 8, the sensing voltage receiver 710 may be implemented with '2m' number of transistors, and the comparison voltage generator may be implemented with '2m+2' number of transistors. In FIG. 8, the number of page buffers is 'm'.

The sensing voltages SO1, ..., and SOm received by the sensing voltage receiver 710 may be respectively input to the m transistors TR21, ..., and TR2m. The series-connected transistors included in the sensing voltage receiver 710 may indicate the sensing data received from the page buffer. The sensing voltage receiver 710 may provide the sensing voltages to the comparison voltage generator 720.

The comparison voltage generator 720 may generate the comparison voltage provided to the comparison circuit 740 based on the first signal and the second signal among the sensing voltages provided by the sensing voltage receiver 710. The comparison voltage generator 720 may generate the logical comparison voltage and the physical comparison voltage by using the 2m transistors TR31, ..., and TR3m, and TR41, ..., and TR4m. The comparison voltage generator 720 may provide one of the logical comparison voltage and the physical comparison voltage to the comparison circuit 740 using two transistors TR5 and TR6.

In FIG. 8, the number of page buffers is 1024, and a column address of a sensing voltage connected through TR31 and TR41 is number 0. Further, a column address of a sensing voltage connected through TR3n and TR4n is number 513, and a column address of a sensing voltage connected through TR3m and TR4m is number 1023.

The column addresses of the page buffers corresponding to the logical group number 0 INVER_LOG<0> may be from number 0 to number 127. The column addresses of 128 page buffers corresponding to the physical group number 0 INVER_PHY<0> may be number 0, number 8, number 16, ..., and number 1016. The column address of the page buffers corresponding to the physical group number 0 INVER_PHY<0> may have a difference of 8.

Since the transistors TR31 and TR41 corresponding to column address 0 correspond to the logical group number 0 INVER_LOG<0> and the physical group number 0 INVER_PHY<0>, SEL_LOG<0> may be applied to TR31 and SEL_PHY<0> may be applied to TR41. Since the transistors TR3n and TR4n corresponding to column address 513 do not correspond to the logical group number 0 INVER_LOG<0> and the physical group number 0 INVER_PHY<0>, UNSEL_LOG<0> may be applied to TR3n, and UNSEL_PHY<0> may be applied to TR4n. Since the transistors TR3m and TR4m corresponding to column address 1023 do not correspond to the logical group number 0 INVER_LOG<0> and correspond to the physical group number 0 INVER_PHY<0>, UNSEL_LOG<0> may be applied to TR3m, and SEL_PHY<0> may be applied to TR4m.

In an embodiment of the present disclosure, the logical verify operation may be selected according to SEL_LOG<0> applied to TR5. According to SEL_PHY<0> applied to TR6, the physical verify operation may be selected.

Figure 9:
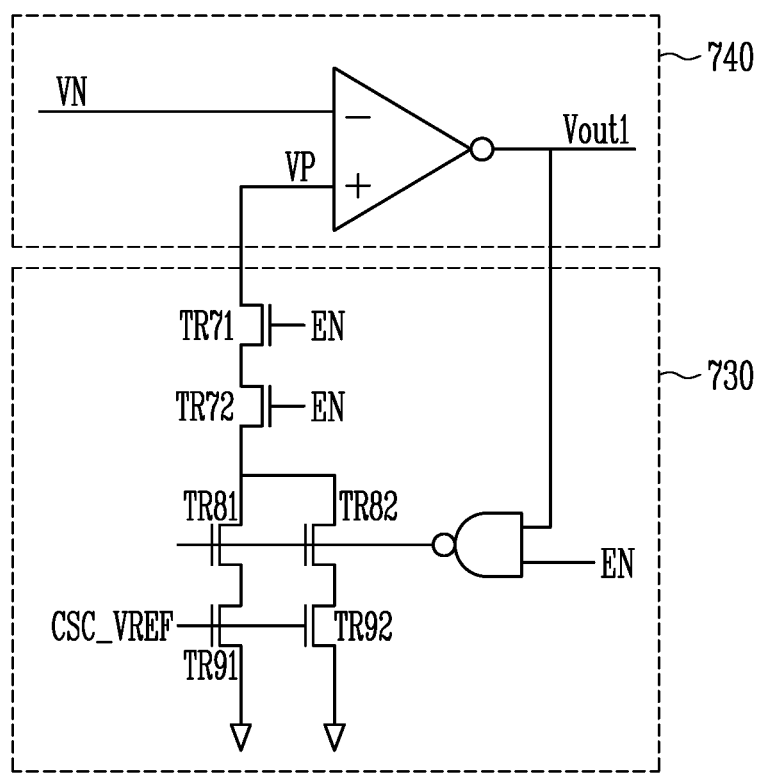
FIG. 9 is a diagram illustrating a comparison circuit and a reference voltage generator of FIG. 7 according to an embodiment of the present disclosure.

FIG. 9 is a diagram illustrating the comparison circuit and the reference voltage generator of FIG. 7 according to an embodiment of the present disclosure.

Referring to FIG. 9, the reference voltage generator 730 may include a plurality of transistors TR71, TR72, TR81, TR82, TR91, and TR92. The comparison circuit 740 may be configured with a differential amplifier.

The reference voltage generator 730 may generate the reference voltage corresponding to the error correctable bit number. TR81 and TR82 included in the reference voltage generator 730 may indicate the error correctable bit number. In an embodiment of the present disclosure, differently from FIGS. 9, TR83 and TR84 may be included in the reference voltage generator 730.

The reference voltage generated by the reference voltage generator 730 may vary according to the number of transistors included therein.

In an embodiment of the present disclosure, TR71 and TR72 may be added to match a current path. In response to the comparison voltage input to the plus terminal VP of the comparison circuit 740 through four transistors, the reference voltage input to the minus terminal VN of the comparison circuit 740 may also be input through four transistors. As the reference voltage passes through the transistor, a voltage drop may occur by a predetermined amount.

The comparison circuit 740 may compare the provided comparison voltage with the reference voltage. The comparison result may be fed back as a gate voltage of the transistors TR81 and TR82 indicating the error correctable bit number of the reference voltage generator 730.

When the comparison voltage provided through the plus terminal VP of the comparison circuit 740 is the logical comparison voltage, an output Vout1 may be a logical verify result. At this time, the output Vout1 may be a verify result for logical group number 0. Similarly, when the comparison voltage provided through the plus terminal VP of the comparison circuit 740 is the physical comparison voltage, the output Vout1 may be a physical verify result. At this time, the output Vout1 may be a verify result for physical group number 0.

FIG. 10 is a diagram illustrating a method of grouping a plurality of page buffers into a physical group according to an embodiment of the present disclosure.

Referring to FIG. 10, physical pages may be grouped into 16 physical groups. The physical pages may be divided according to a bank number of a cell matrix. Also in the same bank number, the physical pages may be divided into the LOW BYTE and the HIGH BYTE. Also in the LOW BYTE, the physical pages may be divided by whether a bit line number is an odd number or an even number (1010).

In FIG. 10, the logical group number may be determined by the column address. The physical group number in the physical page may be determined according to adjacent page buffers. In an embodiment of the present disclosure, the physical group number may be determined according to a number of the bit line. A page buffer having an odd bit line number may have a physical group number different from that of a page buffer having an even bit line number.

In another embodiment of the present disclosure, the physical group number may be determined so that the bit line numbers are consecutive (1020). According to an embodiment of the present disclosure, the adjacent page buffers in the physical page may be grouped together. The number of groups of the page buffers may be 16. The number of page buffers corresponding to the physical group number may be the same.

FIG. 11 is a flowchart illustrating a method of performing a verify operation according to an embodiment of the present disclosure.

Referring to FIG. 11, the verify operation may be performed in the memory device. The verify operation may be performed for each of the page buffer groups having the same logical group number. The verify operation may be performed for each of the page buffer groups having the same physical group number. The current sensing circuit may output the verify pass signal in response to both of the result of the logical verify operation and the result of the physical verify operation satisfying the verify pass criterion.

In operation S1110, the control logic may determine the predetermined number of page buffers having consecutive column addresses to have the same logical group number. In operation S1120, the control logic may determine a predetermined number of page buffers adjacent in the read and write circuit to have the same physical group number.

The control logic may group the plurality of page buffers into the plurality of page buffer groups. The control logic may control the current sensing circuit to perform the verify operation on each of the plurality of page buffer groups. The control logic may determine the logical group number and the physical group number corresponding to the column address of each of the plurality of page buffers.

The control logic may determine page buffers having consecutive column addresses among the plurality of page buffers to have the same logical group number. At this time, the number of page buffers having the same logical group number may be predetermined. For example, when the column addresses of the plurality of page buffers are from number 0 to number 1024, it may be determined that the number of page buffers having the same logical group number is 128. The control logic may determine that the logical group number of the page buffers corresponding to column addresses from number 0 to number 127 is number 0. Similarly, the control logic may determine that the logical group number of the page buffers corresponding to column addresses from number 128 to number 255 is number 1.

The control logic may determine adjacent page buffers in the read and write circuit 130 among the plurality of page buffers to have the same physical group number. At this time, the number of page buffers having the same physical group number may be predetermined. It may be determined that the number of page buffers having the same physical group number is 128. For example, the control logic may determine that 128 page buffers adjacent in the read and write circuit 130 are physical group number 0. Column addresses of page buffers having the physical group number may have a difference of 8. That is, the column addresses may be number 0, number 8, number 16, . . . , and number 1016 for the page buffers having the physical group number 0.

In an embodiment of the present disclosure, the control logic may determine the logical group number and the physical group number based on a layout of the plurality of page buffers. The layout of the plurality of page buffers may vary according to a design of the memory device.

In operation S1130, the control logic may control to perform the first verify operation, which is the verify operation for each of the page buffer groups having the same logical group number. The control logic may transmit the first signal indicating the page buffers respectively corresponding to the logical group numbers to the current sensing circuit.

The control logic may transmit the first signal indicating the page buffers corresponding to the logical group number to the current sensing circuit. For example, the first signal may indicate that the logical group number of the page buffers corresponding to the column addresses from number 0 to number 127 is number 0, and the logical group number of the page buffers corresponding to the column addresses from number 128 to number 255 is number 1.

In operation S1140, the control logic may control to perform the second verify operation, which is the verify operation for each of the page buffer groups having the same physical group number. The control logic may transmit the second signal indicating the page buffers respectively corresponding to the physical group numbers to the current sensing circuit.

The control logic 140 may transmit the second signal indicating the page buffers corresponding to the physical group number to the current sensing circuit. For example, the second signal may indicate that a physical group number of page buffers corresponding to a low byte in bank number 0 is number 0, and a physical group number of page buffers corresponding to a high byte in the bank number 0 is number 1. In another embodiment of the present disclosure, the second signal may indicate that a physical group number of page buffers in which the column address of the page buffer has a difference of 8, such as 0, 8, 16, . . . , and 1016, is number 0.

In operation S1150, the current sensing circuit may output the verify pass signal in response to both results of the first verify operation and the second verify operation satisfying the pass criterion. The current sensing circuit may perform the first verify operation and the second verify operation in a reverse order. The current sensing circuit may output the verify fail signal in response to the result of the first verify operation that does not satisfy the pass criterion. Even though the result of the first verify operation satisfies the pass criterion, when the result of the second verify operation does not satisfy the pass criterion, the current sensing circuit may output the verify fail signal.

The current sensing circuit may output the verify pass signal only when both of the logical verify operation and the physical verify operation satisfy the pass condition. The current sensing circuit may compare the sensing voltage corresponding to the page buffer group with the reference voltage corresponding to the error correctable bit number. When the fail bit included in the page buffer group is distributed, the fail bit may exist even though the verify pass is output. Since the column addresses of the page buffers included in the page buffer group are different from each other, the logical verify operation and the physical verify operation may be complementary to each other.

The current sensing circuit may output the verify fail signal when one of the result of the logical verify operation and the result of the physical verify operation does not satisfy the pass condition. In an embodiment of the present disclosure, the pass conditions of the logical verify operation and the physical verify operation may be different from each other.

The verify operation of FIG. 11 may correspond to the verify operation of the present disclosure described with reference to FIGS. 4 to 9.

Figure 12:
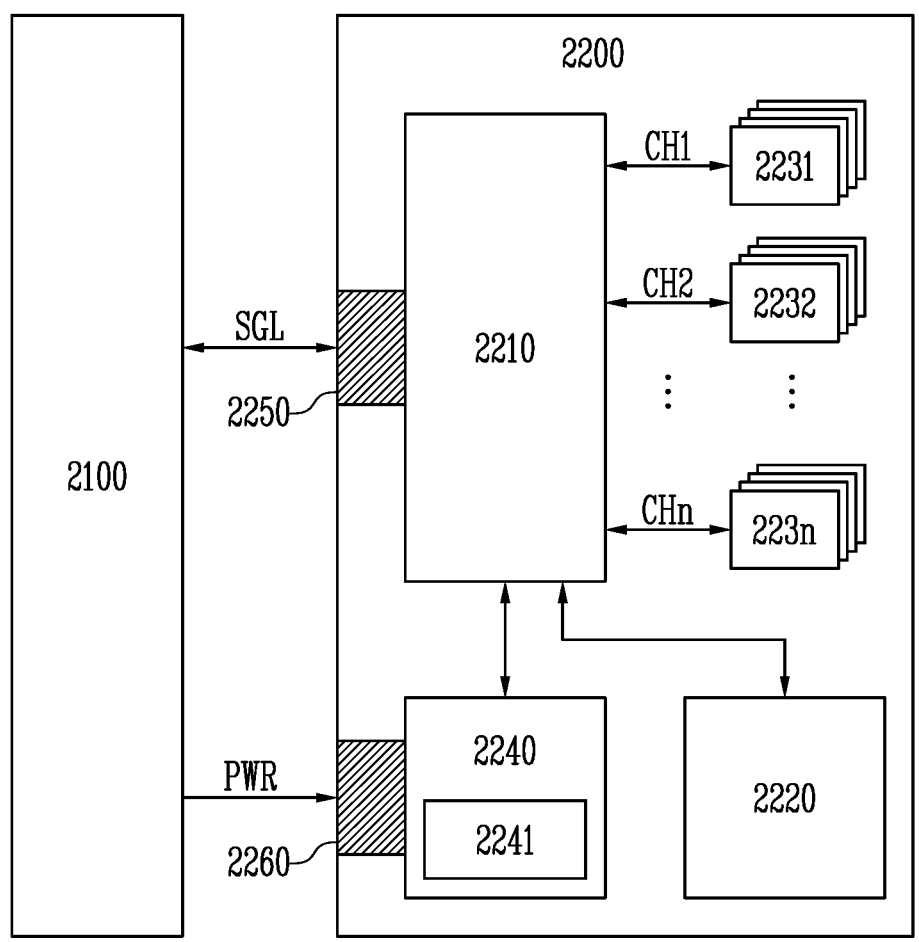
FIG. 12 is a diagram illustrating a data processing system including a solid state drive according to an embodiment of the present disclosure.

FIG. 12 is a diagram illustrating a data processing system including a solid state drive (SSD) according to an embodiment of the present disclosure. Referring to FIG. 12, the data processing system 2000 may include a host device 2100 and an SSD 2200.

The SSD 2200 may include a controller 2210, a buffer memory device 2220, nonvolatile memories 2231 to 223n, a power supply 2240, a signal connector 2250, and a power connector 2260. The controller 2210 may control an overall operation of the SSD 2200.

The buffer memory device 2220 may temporarily store data to be stored in the nonvolatile memories 2231 to 223n. In addition, the buffer memory device 2220 may temporarily store data read from the nonvolatile memories 2231 to 223n. The data temporarily stored in the buffer memory device 2220 may be transmitted to the host device 2100 or the nonvolatile memories 2231 to 223n under control of the controller 2210.

The nonvolatile memories 2231 to 223n may be used as a storage medium of the SSD 2200. Each of the nonvolatile memories 2231 to 223n may be connected to the controller 2210 through a plurality of channels CH1 to CHn. One or more nonvolatile memories may be connected to one channel. The nonvolatile memories connected to one channel may be connected to the same signal bus and data bus.

The power supply 2240 may provide power PWR input through the power connector 2260 into the SSD 2200. The power supply 2240 may include an auxiliary power supply 2241. The auxiliary power supply 2241 may supply power so that the SSD 2200 is normally ended when a sudden power off occurs. The auxiliary power supply 2241 may include large capacity capacitors capable of charging the power PWR.

The controller 2210 may exchange a signal SGL with the host device 2100 through the signal connector 2250. Here, the signal SGL may include a command, an address, data, and the like. The signal connector 2250 may be configured as various types of connectors according to an interface method between the host device 2100 and the SSD 2200.

Figure 13:
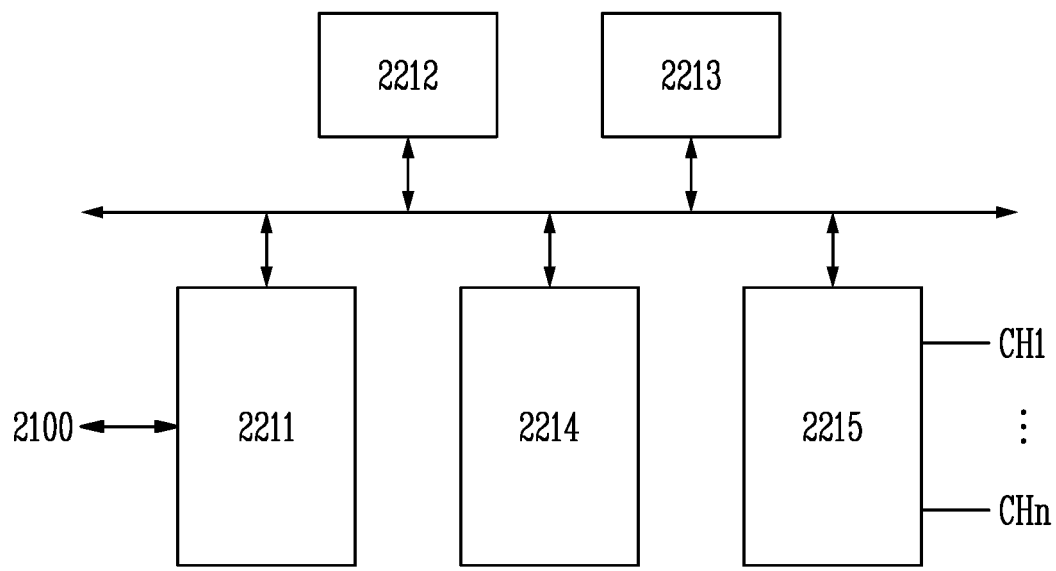
FIG. 13 is a diagram illustrating a configuration of the controller of FIG. 12.

FIG. 13 is a diagram illustrating a configuration of the controller of FIG. 12 according to an embodiment of the present disclosure. Referring to FIG. 13, the controller 2210 may include a host interface unit 2211, a control unit 2212, a random access memory 2213, an error correction code (ECC) unit 2214, and a memory interface unit 2215.

The host interface unit 2211 may interface the host device 2100 and the SSD 2200 according to a protocol of the host device 2100. For example, the host interface unit 2211 may communicate with the host device 2100 through one of secure digital, universal serial bus (USB), multi-media card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI Express (PCI-e or PCIe), and universal flash storage (UFS) protocols. In addition, the host interface unit 2211 may perform a disk emulation function that supports the host device 2100 to recognize the SSD 2200 as a general-purpose data storage device, for example, a hard disk drive (HDD).

The control unit 2212 may analyze and process the signal SGL input from the host device 2100. The control unit 2212 may control an operation of internal functional blocks according to firmware or software for driving the SSD 2200. The random access memory 2213 may be used as an operation memory for driving such firmware or software.

The ECC unit 2214 may generate parity data of data to be transmitted to the nonvolatile memories 2231 to 223n. The generated parity data may be stored in the nonvolatile memories 2231 to 223n together with the data. The ECC unit 2214 may detect an error of data read from the nonvolatile memories 2231 to 223n based on the parity data. When the detected error is within a correction range, the ECC unit 2214 may correct the detected error.

The memory interface unit 2215 may provide a control signal such as a command and an address to the nonvolatile memories 2231 to 223n under control of the control unit 2212. In addition, the memory interface unit 2215 may exchange data with the nonvolatile memories 2231 to 223n under the control of the control unit 2212. For example, the memory interface unit 2215 may provide the data stored in the buffer memory device 2220 to the nonvolatile memories 2231 to 223n, or provide the data read from the nonvolatile memories 2231 to 223n to the buffer memory device 2220.

Figure 14:
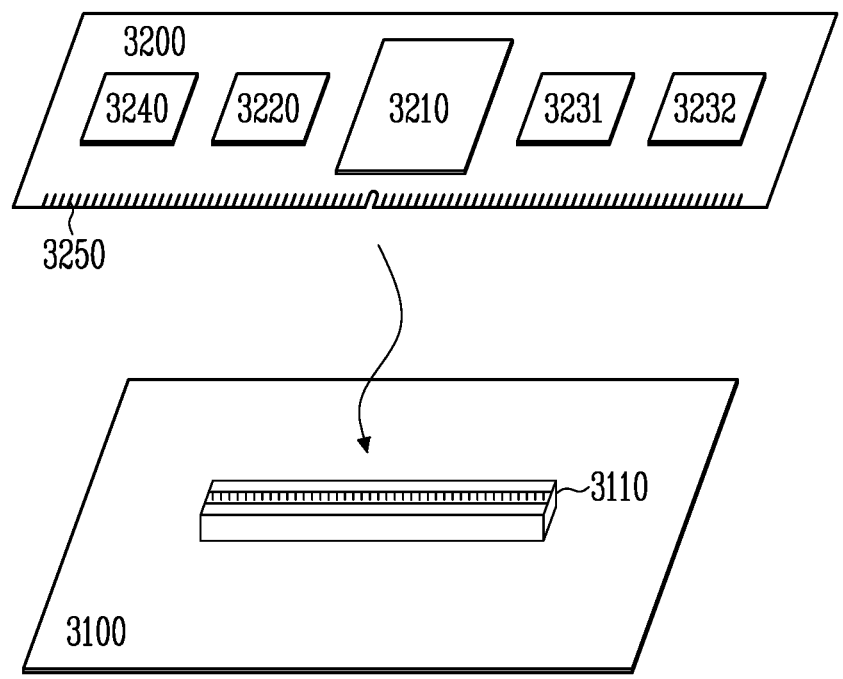
FIG. 14 is a diagram illustrating a data processing system including a data storage device according to an embodiment of the present disclosure.

FIG. 14 is a diagram illustrating a data processing system including a data storage device according to an embodiment of the present disclosure. Referring to FIG. 14, the data processing system 3000 may include a host device 3100 and a data storage device 3200.

The host device 3100 may be configured in a form of a board such as a printed circuit board. Although not shown, the host device 3100 may include internal functional blocks for performing a function of the host device.

The host device 3100 may include a connection terminal 3110 such as a socket, a slot, or a connector. The data storage device 3200 may be mounted on the connection terminal 3110.

The data storage device 3200 may be configured in a form of a board such as a printed circuit board. The data storage device 3200 may be referred to as a memory module or a memory card. The data storage device 3200 may include a controller 3210, a buffer memory device 3220, nonvolatile memories 3231 to 3232, a power management integrated circuit (PMIC) 3240, and a connection terminal 3250.

The controller 3210 may control an overall operation of the data storage device 3200. The controller 3210 may be configured identically to the controller 2210 shown in FIG. 12.

The buffer memory device 3220 may temporarily store data to be stored in the nonvolatile memories 3231 to 3232. In addition, the buffer memory device 3220 may temporarily store data read from the nonvolatile memories 3231 to 3232. The data temporarily stored in the buffer memory device 3220 may be transmitted to the host device 3100 or the nonvolatile memories 3231 to 3232 under control of the controller 3210.

The nonvolatile memories 3231 to 3232 may be used as a storage medium of the data storage device 3200.

The PMIC 3240 may provide power input through the connection terminal 3250 into the data storage device 3200. The PMIC 3240 may manage the power of the data storage device 3200 according to the control of the controller 3210.

The connection terminal 3250 may be connected to the connection terminal 3110 of the host device. Power and a signal such as a command, an address, and data may be transmitted between the host device 3100 and the data storage device 3200 through the connection terminal 3250. The connection terminal 3250 may be configured as various types according to an interface method between the host device 3100 and the data storage device 3200. The connection terminal 3250 may be disposed on any side of the data storage device 3200.

Figure 15:
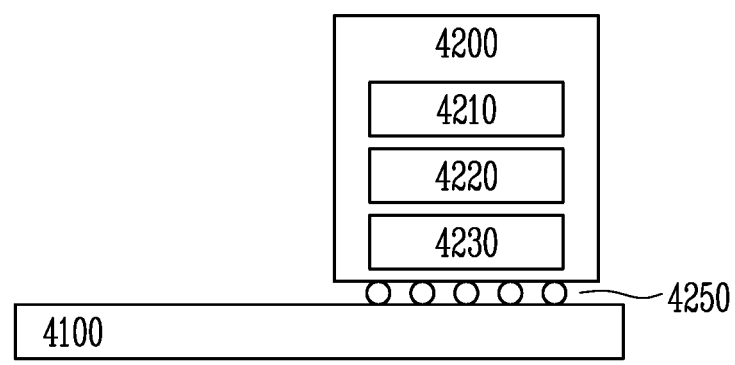
FIG. 15 is a diagram illustrating a data processing system including a data storage device according to an embodiment of the present disclosure.

FIG. 15 is a diagram illustrating a data processing system including a data storage device according to an embodiment of the present disclosure. Referring to FIG. 15, the data processing system 4000 may include a host device 4100 and a data storage device 4200.

The host device 4100 may be configured in a form of a board such as a printed circuit board. Although not shown, the host device 4100 may include internal functional blocks for performing a function of the host device.

The data storage device 4200 may be configured in a form of a surface mounted package. The data storage device 4200 may be mounted on the host device 4100 through a solder ball 4250. The data storage device 4200 may include a controller 4210, a buffer memory device 4220, and a nonvolatile memory 4230.

The controller 4210 may control an overall operation of the data storage device 4200. The controller 4210 may be configured identically to the controller 2210 shown in FIG. 12.

The buffer memory device 4220 may temporarily store data to be stored in the nonvolatile memory 4230. In addition, the buffer memory device 4220 may temporarily store data read from the nonvolatile memories 4230. The data temporarily stored in the buffer memory device 4220 may be transmitted to the host device 4100 or the nonvolatile memory 4230 under control of the controller 4210.

The nonvolatile memory 4230 may be used as a storage medium of the data storage device 4200.

Figure 16:
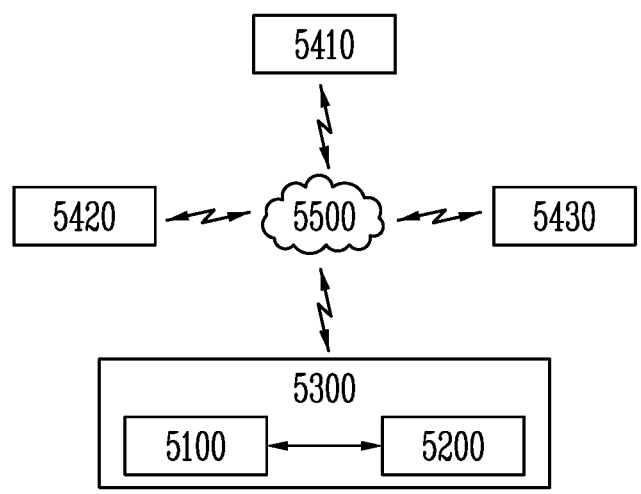
FIG. 16 is a diagram illustrating a network system including a data storage device according to an embodiment of the present disclosure.

FIG. 16 is a diagram illustrating a network system including a data storage device according to an embodiment of the present disclosure. Referring to FIG. 16, the network system 5000 may include a server system 5300 and a plurality of client systems 5410 to 5430 connected through a network 5500.

The server system 5300 may service data in response to a request of the plurality of client systems 5410 to 5430. For example, the server system 5300 may store data provided from the plurality of client systems 5410 to 5430. As another example, the server system 5300 may provide data to the plurality of client systems 5410 to 5430.

The server system 5300 may include a host device 5100 and a data storage device 5200. The data storage device 5200 may include the storage device 50 of FIG. 1, the SSD 2200 of FIG. 12, the data storage device 3200 of FIG. 14, and the data storage device 4200 of FIG. 15.

Since the present disclosure may be implemented in other specific forms without changing the technical spirit or essential features thereof, those of ordinary skill in the art to which the present disclosure pertains should understand that the embodiments described above are illustrative and are not limited in all aspects. The scope of the present disclosure is indicated by the claims to be described later rather than the detailed description, and all changes or modifications derived from the meaning and scope of the claims and their equivalent concepts are interpreted as being included in the scope of the present disclosure. Furthermore, the embodiments may be combined to form additional embodiments.

What is claimed is:

1. A memory device comprising:
   a memory block including memory cells;
   a read and write circuit including a plurality of page buffers respectively connected to the memory cells through a plurality of bit lines;
   a current sensing circuit configured to perform a verify operation of comparing sensing voltages received from the plurality of page buffers with a reference voltage corresponding to an error correctable bit number; and
   a control logic configured to group the plurality of page buffers into a plurality of page buffer groups, and control the current sensing circuit to perform the verify operation for each of the plurality of page buffer groups,
   wherein the control logic is further configured to determine a logical group number and a physical group number of each of the plurality of page buffers based on a column address of each of the plurality of page buffers, and configured to control the current sensing circuit to perform a first verify operation on the sensing voltages of each of page buffer groups having a same logical group number, and perform a second verify operation on the sensing voltages of each of page buffer groups having a same physical group number,
   wherein column addresses of the page buffers having the same logical group number are consecutive,
   wherein column addresses of the page buffers having the same physical group number increase by a number of physical groups sequentially, and
   wherein the current sensing circuit is further configured to output a verify pass signal in response to both results of the first verify operation and the second verify operation satisfying a pass criterion.

2. The memory device of claim 1, wherein the control logic determines a predetermined number of page buffers having consecutive column addresses among the plurality of page buffers to have the same logical group number.

3. The memory device of claim 2, wherein the control logic determines a predetermined number of page buffers adjacent in the read and write circuit among the plurality of page buffers to have the same physical group number.

4. The memory device of claim 3, wherein the control logic determines the logical group number and the physical group number based on a layout of the plurality of page buffers.

5. The memory device of claim 3, wherein the control logic is further configured to transmit a first signal indicating the page buffers corresponding to the logical group number, to the current sensing circuit.

6. The memory device of claim 5, wherein the control logic is further configured to transmit a second signal indicating the page buffers corresponding to the physical group number, to the current sensing circuit.

7. The memory device of claim 6, wherein the current sensing circuit comprises:
   a sensing voltage receiver configured to receive the sensing voltages from the plurality of page buffers;
   a comparison voltage generator configured to generate a comparison voltage that is a sum of the sensing voltages to be compared with the reference voltage among the sensing voltages based on the first signal and the second signal;
   a reference voltage generator configured to generate the reference voltage; and
   a plurality of comparators each including a comparison circuit configured to output a comparison result obtained by comparing the comparison voltage with the reference voltage.

8. The memory device of claim 7, wherein the comparison voltage generator generates, as the comparison voltage, a logical comparison voltage that is a sum of the sensing voltages corresponding to the first signal.

9. The memory device of claim 8, wherein the comparison circuit performs the first verify operation of comparing the logical comparison voltage with the reference voltage, and outputs the comparison result of the first verify operation.

10. The memory device of claim 8, wherein the comparison voltage generator generates the logical comparison voltage using at least two or more transistors connected in series.

11. The memory device of claim 7, wherein the comparison voltage generator generates, as the comparison voltage, a physical comparison voltage that is a sum of the sensing voltages corresponding to the second signal.

12. The memory device of claim 11, wherein the comparison circuit performs the second verify operation of comparing the physical comparison voltage with the reference voltage, and outputs the comparison result of the second verify operation.

13. The memory device of claim 11, wherein the comparison voltage generator generates the physical comparison voltage using at least two or more transistors connected in series.

14. The memory device of claim 7, wherein the reference voltage generator generates, as the reference voltage, a first reference voltage corresponding to the comparison voltage generated based on the first signal and generates, as the reference voltage, a second reference voltage corresponding to the comparison voltage generated based on the second signal.

15. The memory device of claim 14, wherein the first reference voltage and the second reference voltage are different from each other.

16. The memory device of claim 14, wherein the reference voltage generator further includes at least one transistor corresponding to a number of transistors configuring the comparison voltage generator.

17. The memory device of claim 7, wherein a number of the comparators is the same as a number of the plurality of page buffer groups.

18. A method of operating a memory device comprising a read and write circuit including a plurality of page buffers respectively connected to memory cells included in a memory block through a plurality of bit lines, a current sensing circuit configured to perform a verify operation of comparing sensing voltages received from the plurality of page buffers with a reference voltage corresponding to an error correctable bit number, and a control logic configured to group the plurality of page buffers into a plurality of page buffer groups, and control the current sensing circuit to perform the verify operation for each of the plurality of page buffer groups, the method comprising:
   determining a logical group number of page buffers having consecutive column addresses to be the same among the plurality of page buffers;
   determining a physical group number of page buffers whose column addresses increase by a number of physical groups sequentially to be the same among the plurality of page buffers;
   performing a first verify operation on the sensing voltages of each of the page buffer groups having a same logical group number;
   performing a second verify operation on the sensing voltages of each of the page buffer groups having a same physical group number; and
   outputting a verify pass signal in response to both results of the first verify operation and the second verify operation satisfying a pass criterion.

19. The method of claim 18, further comprising:
   transmitting a first signal indicating the page buffers corresponding to the logical group number to the current sensing circuit; and
   transmitting a second signal indicating the page buffers corresponding to the physical group number to the current sensing circuit.

20. The method of claim 19, wherein outputting the verify pass signal comprises:
   receiving the sensing voltages from the plurality of page buffers;
   generating a comparison voltage that is a sum of the sensing voltages to be compared with the reference voltage among the sensing voltages based on the first signal and the second signal;
   generating the reference voltage; and
   outputting a comparison result obtained by comparing the comparison voltage with the reference voltage.

* * * * *